(12) United States Patent
Manna et al.

(10) Patent No.: US 10,699,903 B2
(45) Date of Patent: Jun. 30, 2020

(54) TWO-STEP PROCESS FOR GAPFILLING HIGH ASPECT RATIO TRENCHES WITH AMORPHOUS SILICON FILM

(71) Applicant: Applied Materials, Inc., Santa Clara, CA (US)

(72) Inventors: Pramit Manna, Santa Clara, CA (US); Shishi Jiang, Santa Clara, CA (US); Rui Cheng, Santa Clara, CA (US); Abhijit Basu Mallick, Fremont, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/659,194

(22) Filed: Oct. 21, 2019

(65) Prior Publication Data

US 2020/0051815 A1 Feb. 13, 2020

Related U.S. Application Data

(62) Division of application No. 15/936,751, filed on Mar. 27, 2018, now Pat. No. 10,460,933.

(60) Provisional application No. 62/479,353, filed on Mar. 31, 2017.

(51) Int. Cl.
*H01L 21/00* (2006.01)
*H01L 21/02* (2006.01)
*H01L 21/762* (2006.01)
*H01L 29/06* (2006.01)

(52) U.S. Cl.
CPC .... *H01L 21/02532* (2013.01); *H01L 21/0243* (2013.01); *H01L 21/0245* (2013.01); *H01L 21/0262* (2013.01); *H01L 21/02381* (2013.01); *H01L 21/02592* (2013.01);
(Continued)

(58) Field of Classification Search
CPC .......... H01L 21/02532; H01L 21/0243; H01L 21/02488; H01L 21/02592; C23C 16/0245; C23C 16/045
See application file for complete search history.

(56) References Cited

U.S. PATENT DOCUMENTS

| 7,470,617 B2* | 12/2008 | Chebiam | ................ H01L 21/288 257/E21.174 |
| 7,947,551 B1* | 5/2011 | Syue | ................. H01L 21/02274 257/374 |
| 9,330,939 B2 | 5/2016 | Zope et al. | |

(Continued)

*Primary Examiner* — Nicholas J Tobergte
(74) *Attorney, Agent, or Firm* — Patterson + Sheridan LLP

(57) ABSTRACT

Methods for gapfilling semiconductor device features, such as high aspect ratio trenches, with amorphous silicon film are provided. First, a substrate having features formed in a first surface thereof is positioned in a processing chamber. A conformal deposition process is then performed to deposit a conformal silicon liner layer on the sidewalls of the features and the exposed first surface of the substrate between the features. A flowable deposition process is then performed to deposit a flowable silicon layer over the conformal silicon liner layer. A curing process is then performed to increase silicon density of the flowable silicon layer. Methods described herein generally improve overall etch selectivity by the conformal silicon deposition and the flowable silicon deposition two-step process to realize seam-free gapfilling between features with high quality amorphous silicon film.

20 Claims, 3 Drawing Sheets

(52) U.S. Cl.
CPC .. *H01L 21/02617* (2013.01); *H01L 21/02664* (2013.01); *H01L 21/76224* (2013.01); *H01L 29/0649* (2013.01)

(56) References Cited

U.S. PATENT DOCUMENTS

| | | |
|---|---|---|
| 2006/0234470 A1* | 10/2006 | Paranjpe ............ H01L 29/66181 438/424 |
| 2010/0022067 A1 | 1/2010 | Tang et al. |
| 2010/0072569 A1 | 3/2010 | Han et al. |
| 2012/0142192 A1* | 6/2012 | Li ..................... H01L 21/02274 438/700 |
| 2012/0270380 A1 | 10/2012 | Eun |
| 2015/0064929 A1 | 3/2015 | Tseng et al. |
| 2015/0187563 A1 | 7/2015 | Underwood et al. |
| 2016/0141176 A1 | 5/2016 | Van Aerde et al. |
| 2018/0294154 A1* | 10/2018 | Manna .................. C23C 16/505 |

* cited by examiner

TWO-STEP PROCESS FOR GAPFILLING HIGH ASPECT RATIO TRENCHES WITH AMORPHOUS SILICON FILM

CROSS-REFERENCE TO RELATED APPLICATIONS

This application is a divisional of patent application Ser. No. 15/936,751, filed Mar. 27, 2018, which claims benefit of U.S. provisional patent application Ser. No. 62/479,353, filed Mar. 31, 2017, each of which is herein incorporated by reference.

BACKGROUND

Field

Examples of the present disclosure generally relate to semiconductor manufacturing processes, more particularly, to methods for gapfilling high aspect ratio trenches of semiconductor devices with amorphous silicon film, and devices formed thereby.

Description of the Related Art

For many semiconductor device manufacturing processes, there is a need to fill narrow trenches having high aspect ratios greater than, for example, 10:1, with no voiding. One example of such a process is shallow trench isolation (STI) in which the film needs to be of high quality and have very low leakage throughout the trench. As the dimensions of semiconductor device structures continue to decrease and the aspect ratios increase, post-curing processes become increasingly difficult and result in films with varying composition throughout the filled trench.

Conventionally, amorphous silicon (a-Si) has been used in semiconductor manufacturing processes since a-Si generally provides good etch selectivity with respect to other films, such as silicon oxide (SiO) and amorphous carbon (a-C). The conventional a-Si deposition methods, such as plasma-enhanced chemical vapor deposition (PECVD) and conformal deposition, however, cannot be used to gapfill high aspect ratio trenches because a seam forms in the high aspect ratio trenches. A seam includes gaps that form in the trench between the sidewalls, which are further opened up during post-curing processes and ultimately cause decreased throughput or even semiconductor device failure. Moreover, PECVD of a-Si generally results in voiding at the bottom of the trench, which may also result in decreased device performance or even failure.

Therefore, there is a need for methods for gapfilling high aspect ratio trenches of semiconductor devices that can provide seam-free film growth.

SUMMARY

Methods for gapfilling semiconductor device features, such as high aspect ratio trenches, with amorphous silicon film are provided. First, a substrate having features formed in a first surface thereof is positioned in a processing chamber. A conformal deposition process is then performed to deposit a conformal silicon liner layer on the sidewalls of the features and the exposed first surface of the substrate between the features. A flowable deposition process is then performed to deposit a flowable silicon layer over the conformal silicon liner layer. A curing process is then performed to increase silicon density of the flowable silicon layer. Methods described herein generally improve overall etch selectivity by the conformal silicon deposition and the flowable silicon deposition two-step process to realize seam-free gapfilling between features with high quality amorphous silicon film.

In one example, a method for manufacturing a semiconductor device is disclosed. The method includes providing a substrate having at least one feature formed in a surface thereof, the at least one feature having sidewalls and a bottom surface, conformally depositing a silicon liner layer over the substrate surface, the sidewalls and the bottom surface of the at least one feature, filling the at least one feature with a flowable silicon film, and curing the silicon liner layer and the flowable silicon film to solidify the silicon liner layer and the flowable silicon film and form a substantially seam-free gapfill.

In another example, a method for manufacturing a semiconductor device is disclosed. The method includes providing a substrate having at least one feature formed in a surface thereof, the at least one feature having sidewalls and a bottom surface, conformally depositing a silicon liner layer over the substrate surface and the sidewalls and the bottom surface of the at least one feature, the silicon liner layer having a hydrogen concentration of less than about 5%, filling the at least one feature with a flowable silicon film, the flowable silicon film having a hydrogen concentration of greater than about 30%, and curing the silicon liner layer and the flowable silicon film to solidify the silicon liner layer and the flowable silicon film and form a substantially seam-free gapfill having a hydrogen concentration between about 10% and about 15%.

In yet another example, a semiconductor device is disclosed. The semiconductor device includes a substrate having at least one feature formed in a surface thereof, the at least one feature having sidewalls and a bottom surface, a conformal silicon liner layer disposed over the substrate surface and the sidewalls and the bottom surface of the at least one feature, the silicon liner layer having a hydrogen concentration of less than about 5%, and a flowable silicon film disposed over the conformal silicon liner layer, the flowable silicon liner layer having a hydrogen concentration of greater than about 30%.

BRIEF DESCRIPTION OF THE DRAWINGS

So that the manner in which the above recited features of the present disclosure can be understood in detail, a more particular description of the disclosure, briefly summarized above, may be had by reference to examples, some of which are illustrated in the appended drawings. It is to be noted, however, that the appended drawings illustrate only typical examples of this disclosure and are therefore not to be considered limiting of scope, for the disclosure may admit to other equally effective examples.

To facilitate understanding, identical reference numerals have been used, wherever possible, to designate identical elements that are common to the Figures. Additionally, elements of one example may be advantageously adapted for utilization in other examples described herein.

DETAILED DESCRIPTION

Methods for gapfilling semiconductor device features, such as high aspect ratio trenches, with amorphous silicon film are provided. First, a substrate having features formed in a first surface thereof is positioned in a processing chamber. A conformal deposition process is then performed to deposit a conformal silicon liner layer on the sidewalls of the features and the exposed first surface of the substrate between the features. A flowable deposition process is then performed to deposit a flowable silicon layer over the conformal silicon liner layer. A curing process is then performed to increase silicon density of the flowable silicon layer. Methods described herein generally improve overall etch selectivity by the conformal silicon deposition and the flowable silicon deposition two-step process to realize seam-free gapfilling between features with high quality amorphous silicon film.

Figure 1:
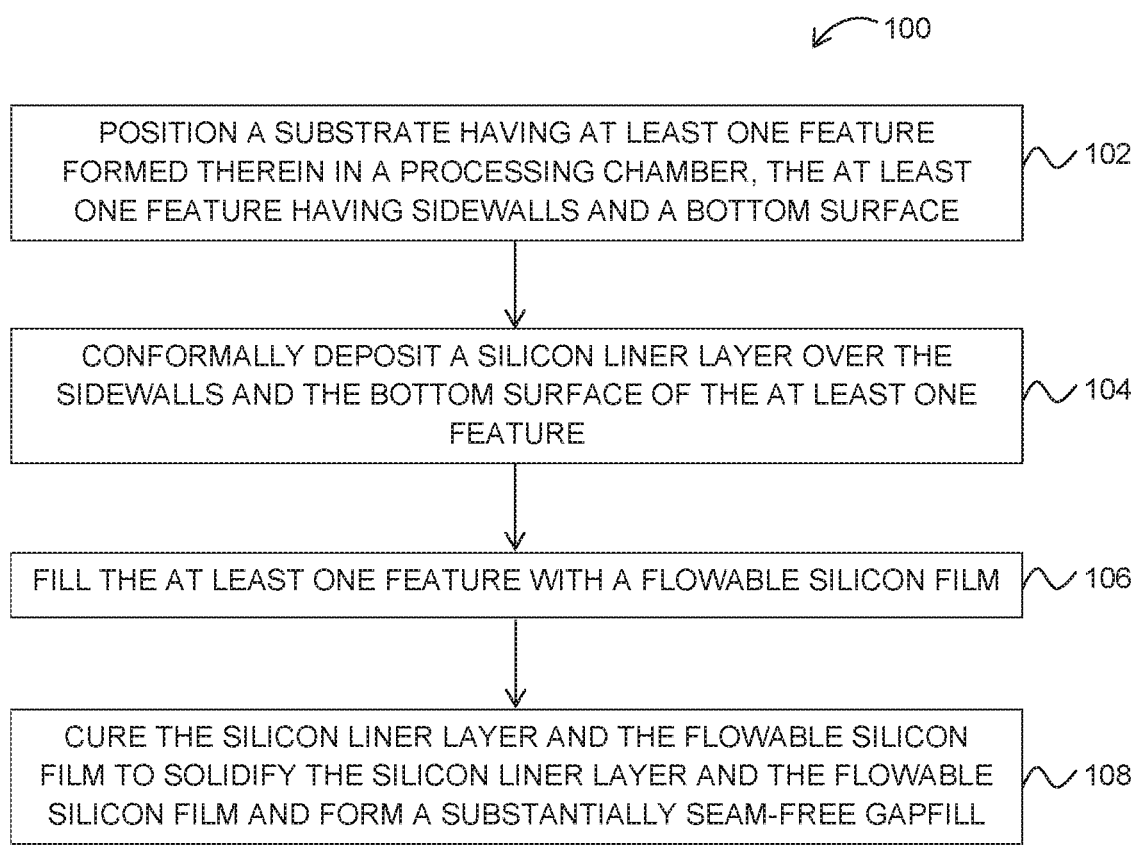
FIG. 1 is a flow diagram summarizing a method according to one example described herein.

FIG. 1 is a flow diagram summarizing a method 100 for gapfilling high aspect ratio trenches of a semiconductor device with amorphous silicon film. FIGS. 2A-2D depict stages of fabrication of a semiconductor device 200 in accordance with the method 100 of FIG. 1. The method 100 is described below in accordance with stages of gapfilling high aspect ratio trenches of a semiconductor device 200 with amorphous silicon film as illustrated in FIGS. 2A-2D. The description that follows will refer to high aspect ratio trenches formed on a substrate; however, methods described herein are also applicable to gapfilling between other semiconductor device features. Features generally have any suitable shape, including, but not limited to, trenches and cylindrical vias. Generally, "feature" means any intentional surface irregularity. Suitable examples of features include, but are not limited to, trenches which have a top, two sidewalls and a bottom, peaks which have a top and two sidewalls. Features can have any suitable aspect ratio, or ratio of the depth of the feature to the width of the feature. In some examples, the aspect ratio is greater than or equal to about 5:1, 10:1, 15:1, 20:1, 25:1, 30:1, 35:1, or 40:1.

Figure 2A:
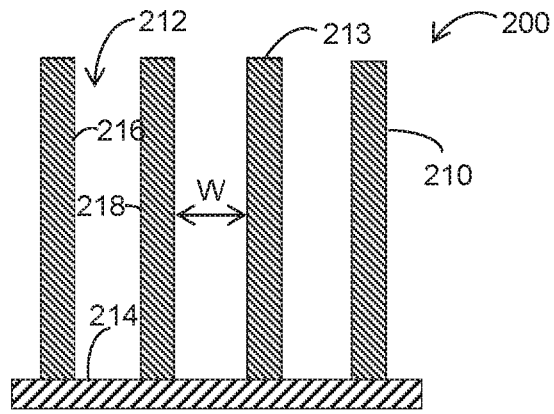
FIGS. 2A-2D depict stages of fabrication of a semiconductor device in accordance with the method of FIG. 1.

The method 100 begins at operation 102 by positioning a substrate 210 with a plurality of features 212 therein (shown as trenches) within a processing chamber. The processing chamber may include a deposition chamber, such as those available from Applied Materials, Inc., of Santa Clara, Calif. The substrate 210 may be any suitable size, for example, a 200 or 300 mm substrate, and may be formed from, for example, silicon, germanium, and combinations thereof. The features 212 extend from a substrate surface 213 to a depth (D) to a bottom surface 214. The features 212 have a first sidewall 216 and a second sidewall 218 that define a width (W) of the feature 212. As shown in FIG. 2A, the substrate 210 has a plurality of features 212; it is contemplated that the substrate 210 can have one or more than one feature 212, or other a different features than those illustrated.

Figure 2B:
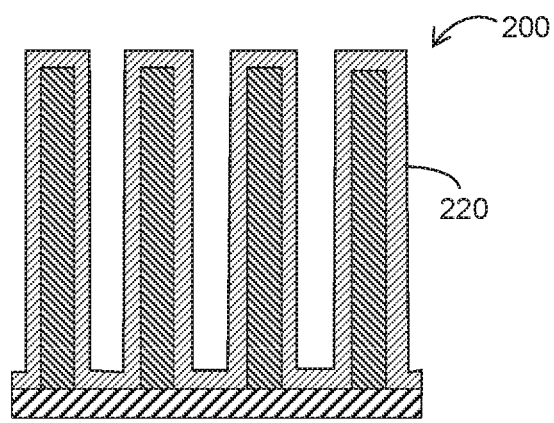

The method 100 continues at operation 104 with conformal deposition of a silicon liner layer 220 in the feature 212, more particularly, over the substrate surface 213, the bottom surface 214, the first sidewall 216, and the second sidewall 218, as shown in FIG. 2B. In one example, the silicon liner layer 220 is deposited on and in contact with the substrate surface 213, the bottom surface 214, the first sidewall 216, and the second sidewall 218. The silicon liner layer 220 generally comprises amorphous silicon having a hydrogen (H) concentration of less than about 6 percent (%), such as about less than about 5%.

In one example, the silicon liner layer 220 is deposited by thermal chemical vapor deposition (CVD). The thermal CVD process generally begins by exposing the substrate surface 213 to a first precursor and supplying heat to the processing environment to activate the first precursor. The first precursor generally includes one or more of silane ($SiH_4$), disilane ($Si_2H_6$), trisilane ($Si_3H_8$), and tetrasilane ($Si_4H_{10}$). The flow rate of the first precursor is generally between about 10 standard cubic centimeters per minute (sccm) and about 1000 sccm. During the thermal CVD process for depositing the silicon liner layer 220, the temperature in the processing environment is generally between about 300 degrees Celsius (° C.) and about 500° C., and the pressure is generally between about 10 Torr and about 600 Torr. Thermal energy to heat the processing environment and/or substrate 210 is provided using a resistive heater embedded in a substrate support of the processing chamber. However, other heating mechanisms, such as lamps, may additionally or alternatively be utilized.

Although the silicon liner layer 220 is described with respect to deposition using thermal CVD, other deposition processes are also contemplated. In another example, the silicon liner layer 220 is deposited by atomic layer deposition (ALD).

The conformally deposited silicon liner layer 220 is generally of suitable thickness to cover the substrate surface 213, the bottom surface 214, the first sidewall 216, and the second sidewall 218 of the features 212, while leaving space for the deposition of an additional amount of amorphous silicon during the second deposition process described below. In an example in which the features 212 have a width (W) of about 20 nanometers (nm), then the silicon liner layer 220 generally has a thickness of about 8 nm, such that there is a 4 nm space between the silicon liner layer 220 deposited on the first sidewall 216 and the second sidewall 218. In one example, the combined thickness of the silicon liner layer deposited on the first sidewall 216 and the second sidewall 218 is about 90% or less of the width (W), such as about 80% or less of width (W), such as 75% or less of width (W), 70% or less of width (W), 65% or less of width (W), 60% or less of width (W). In another example, the combined thickness of the silicon liner layer deposited on the first sidewall 216 and the second sidewall 218 is within a range of about 90%-50% of the width (W), such as about 85%-60% of the width (W), such as about 85%-70% of the width (W).

Figure 2C:
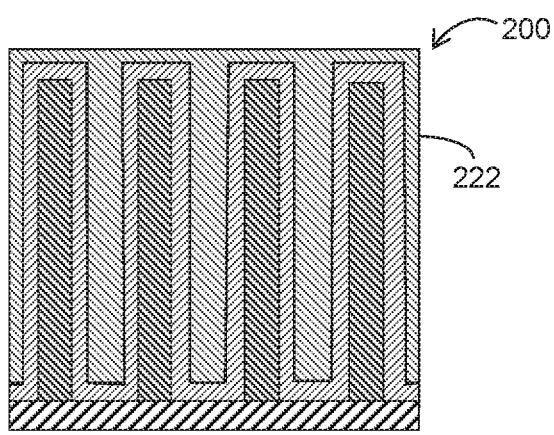

At operation 106, the feature 212 is filled with a flowable silicon film 222, as shown in FIG. 2C. In one example, the flowable silicon film 222 is deposited on and in contact with the silicon liner layer 220. The flowable silicon film 222 generally comprises amorphous silicon having hydrogen (H) concentration of greater than about 30%. The flowable silicon film 222 fills the remaining space in the features 212 so that substantially no seam is formed in the features 212. The flowable silicon film 222 can be deposited by any suitable process.

In one example, the flowable silicon film 222 is deposited by a PECVD process. The PECVD process may be formed in the same or a different processing chamber as the silicon liner layer 220. The PECVD process generally begins by exposing the substrate surface 213 to a reactive gas, which generally includes one or more species. For example, the reactive gas generally includes a second precursor and a plasma gas, which is used as a diluent or carrier gas for the first precursor. The second precursor generally includes one or more of silane ($SiH_4$), disilane ($Si_2H_6$), trisilane ($Si_3H_8$), and tetrasilane ($Si_4H_{10}$). The plasma gas generally includes one or more of helium (He), argon (Ar), hydrogen gas ($H_2$), krypton (Kr), nitrogen gas ($N_2$), oxygen gas ($O_2$), ozone ($O_3$), or ammonia ($NH_3$).

The plasma can be generated or ignited within a processing chamber (e.g., an in situ plasma) or can be generated outside of a processing chamber and flowed into the processing chamber (e.g., a remote plasma). The radiofrequency (RF) power used for igniting the plasma is generally between about 10 watts (W) and about 200 W. During the PECVD process for depositing the flowable silicon film, the temperature in the processing environment is generally between about −100° C. and about 50° C., and the pressure is generally between about 1 Torr and about 10 Torr.

The flowable silicon film 222 is generally of a suitable thickness to fill the remaining space in the features 212. In the example discussed above in which the features 212 have a width (W) of about 20 nm, then the flowable silicon film 222 generally has a thickness of about 4 nm to provide a seam-free gapfill in the features 212.

Figure 2D:
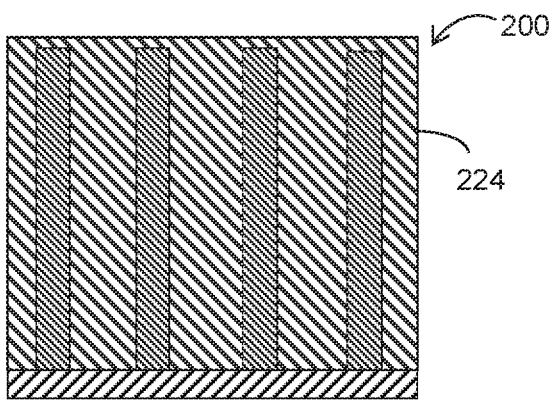

After deposition of the flowable silicon film 222, at operation 108, the silicon liner layer 220 and the flowable silicon film 222 are cured to solidify and form a substantially seam-free gapfill layer 224, as shown in FIG. 2D. Example curing processing include thermal and ultraviolet curing. However, other suitable curing techniques are also contemplated.

In one example, the amorphous silicon of the silicon liner layer 220 and the flowable silicon film 222 is cured by exposing the silicon liner layer 220 and the flowable silicon film 222 to a thermal curing process, such as an in-chamber thermal curing process or a rapid thermal process (RTP) processing method at a temperature between about 100° C. and about 1000° C. More particularly, when the thermal cure occurs in the chamber, the temperature is generally between about 100° C. and about 500° C., and when the process is an RTP process, the temperature is between about 800° C. and about 1000° C., such as 900° C.

In another example, the amorphous silicon of the silicon liner layer 220 and the flowable silicon film 222 is cured by exposing the silicon liner layer 220 and the flowable silicon film 222 to a UV curing process. The temperature during the UV curing process is generally between about 10° C. and about 400° C. The UV curing process may occur for any suitable amount of time, for example, less than or equal to 10 minutes.

In yet another example, the amorphous silicon of the silicon liner layer 220 and the flowable silicon film 222 is cured by exposing the silicon liner layer 220 and the flowable silicon film 222 to a plasma curing process. The plasma exposure to cure the amorphous silicon film comprises a separate plasma exposure from the plasma used in the PECVD process example for depositing the flowable silicon film 222. In one example, the plasma species is the same as the plasma species used in the exemplary PECVD process described above. In another example, the plasma species may be a different plasma species. In an example in which a capacitively coupled plasma (CCP) source is used, the plasma power is between about 100 W and about 1000 W. In an example in which an inductively coupled plasma (ICP) source is used, the plasma power is between about 2000 W and about 10000 W.

After the curing process of operation 108, the silicon liner layer 220 and the flowable silicon film 222 become one uniform gapfill layer 224. As a result of the cure operation, the hydrogen concentration of the flowable silicon film 222 is reduced from greater than 30 percent to less than 20 percent, such as between 15-20 percent, as a result of hydrogen outgassing. The reduction in hydrogen concentration of the flowable silicon film 222 improves the quality of the flowable silicon film. The hydrogen concentration of the silicon liner layer 220 remains at less than 6 percent, such as less than 5 percent during the curing process. Thus, the uniform gapfill layer 224 has increased quality while voids and seams are mitigated or eliminated.

The substrate 210 generally undergoes additional processing operations prior to and/or after forming the silicon liner layer 220 and the flowable silicon film 222. For example, the substrate 210 may undergo an additional annealing or curing process, a deposition process, an etch process, a plating process, or the like.

Figure 3:
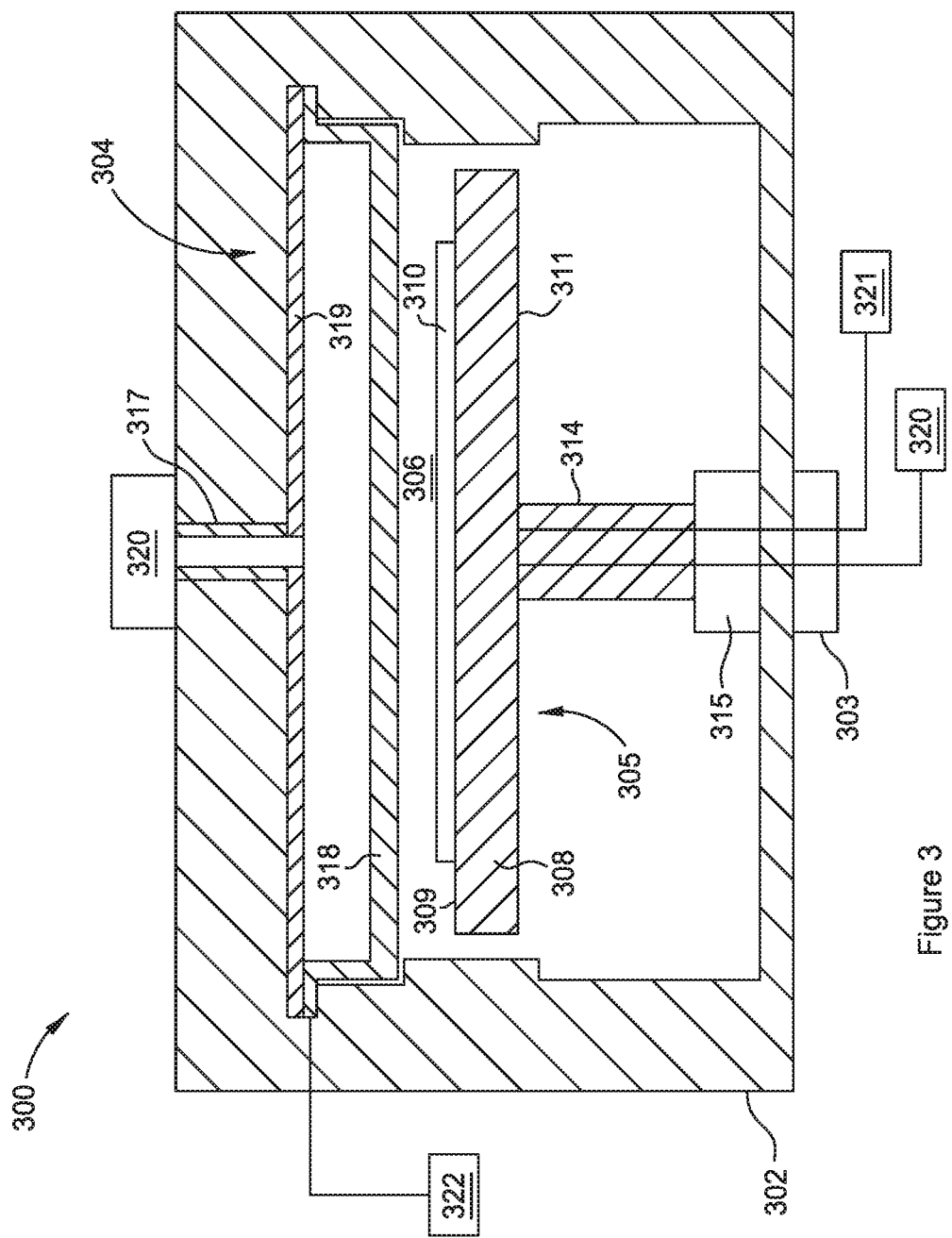
FIG. 3 is a schematic cross-section view of a processing chamber according to an embodiment.

FIG. 3 is a schematic cross-sectional view of a processing chamber 300, according to one embodiment. Exemplary processing chambers are available from Applied Materials, Inc. located in Santa Clara, Calif. It is to be understood that the chamber described below is an exemplary chamber and other chambers, including chambers from other manufacturers, may be used with or modified to accomplish aspects of the present disclosure.

The plasma processing chamber 300 includes a chamber body 302, a substrate support assembly 305, and a gas distribution assembly 304 positioned opposite the substrate support assembly 305 and defining a process volume 306 therebetween. The gas distribution assembly is configured to distribute gases uniformly into the process volume 306 of the plasma processing chamber 300 to facilitate deposition of a film onto a substrate 310 positioned on the substrate support 305. The gas distribution assembly 304 includes a gas inlet passage 317, which delivers gas from a gas flow controller 320 into a gas distribution manifold 318 suspended from a hanger plate 319. The gas distribution manifold 318 includes a plurality of holes or nozzles (not shown) through which gaseous mixtures are injected into the process volume 306 during processing. The gas distribution assembly 304 can be connected to an RF return 322 to allow RF energy applied to a substrate support 308 to generate an electric field within the process volume 306, which is used to generate the plasma for processing of the substrate 310. The ground 322 may alternately be an RF supply. Power supply 320 may provide a DC energy source, while power supply 321 may provide an RF energy source to facilitate plasma generation and/or chucking of the substrate 310.

The substrate support assembly 305 includes the substrate support 308, a base 315, a stem 314 connecting the base 315 to the substrate support 308, and a drive system 303. The substrate support assembly 305 is disposed within the interior volume of the plasma processing chamber 300. The substrate support 308 has an upper surface 309 that supports the substrate 310 and a lower surface 311 for mounting the stem 314 to the substrate support 308. The substrate support 308 is movably disposed in the process volume 306 by the stem 314 that is coupled to the drive system 303 located external of the chamber body 302. The stem 314 and base 315 are connected to the drive system 303 and a bellows (not shown) to allow the substrate support 308 to be raised, lowered, and/or rotated.

During processing, process gases are provided to the process chamber 300 to deposit films in accordance with aspects described above.

The above-described processes, such as the conformal deposition, flowable deposition, and curing processes, may be performed in a single chamber, such as a Producer® chamber available from Applied Materials, Inc. of Santa Clara, Calif., or the above-described processes may be performed in various chambers of a cluster tool comprising multiple chambers which perform various functions, such as the Centura® available from Applied Materials, Inc. of Santa Clara, Calif.

Embodiments of the present disclosure provide high-quality amorphous silicon films for gapfilling high aspect ratio trenches in semiconductor devices. The amorphous silicon gapfill is seam-free, has a low hydrogen concentration between about 10% and about 15% overall, and thus a high silicon density. This seam-free, high-density amorphous silicon gapfill results in improved etch selectivity. For example, the etch selectivity of the disclosed silicon gapfill is greater than the etch selectivity of silicon oxide (SiO). Additionally, the seam-free, high-density amorphous silicon gapfill reduces or eliminates voiding in the high aspect ratio trenches, thus improving overall device performance. More particularly, methods described herein include two silicon deposition processes, a conformal silicon deposition followed by a flowable silicon deposition. While the flowable silicon results in seam-free gapfilling, the flowable silicon has a greater hydrogen concentration, which results in shrinkage upon curing. By performing the two deposition processes, the gapfill of the resultant device has increased silicon density, increased uniformity, and is seam-free.

While the foregoing is directed to examples of the present disclosure, other and further examples of the disclosure may be devised without departing from the basic scope thereof, and the scope thereof is determined by the claims that follow.

What is claimed is:

1. A semiconductor device, comprising:
   a substrate having a substrate surface and at least one feature formed thereon, the at least one feature extending from the substrate surface and having sidewalls and a bottom surface;
   a cured conformal silicon liner layer disposed over the substrate surface and the sidewalls and the bottom surface of the at least one feature; and
   a cured flowable silicon film disposed over the cured conformal silicon liner layer, the cured flowable silicon film filling the at least one feature,
   wherein the cured conformal silicon liner layer and the cured flowable silicon film each comprises amorphous silicon.

2. The semiconductor device of claim 1, wherein the cured conformal silicon liner layer has a hydrogen concentration of less than about 5 percent.

3. The semiconductor device of claim 1, wherein the cured flowable silicon film has a hydrogen concentration of less than about 20 percent.

4. The semiconductor device of claim 1, wherein the cured conformal silicon liner layer is in direct contact with the substrate surface and the sidewalls and the bottom surface of the at least one feature.

5. The semiconductor device of claim 4, wherein the cured flowable silicon film is in direct contact with the cured conformal silicon liner layer.

6. The semiconductor device of claim 1, wherein the at least one feature is a high aspect ratio trench.

7. The semiconductor device of claim 6, wherein the high aspect ratio trench has an aspect ratio of greater than or equal to 10:1.

8. The semiconductor device of claim 7, wherein a combined thickness of the cured conformal silicon liner layer on the sidewalls is less than 90% of a width of the bottom surface of the at least one feature.

9. A semiconductor device, comprising:
   a substrate having a substrate surface and at least one feature formed thereon, the at least one feature extending from the substrate surface and having sidewalls and a bottom surface;
   a conformal silicon liner layer disposed over the substrate surface and the sidewalls and the bottom surface of the at least one feature; and
   a gapfill film disposed over the conformal silicon liner layer, the gapfill film filling the at least one feature, wherein
   the gapfill film is substantially seam-free, and
   the conformal silicon liner layer and the gapfill film each comprises amorphous silicon.

10. The semiconductor device of claim 9, wherein the conformal silicon liner layer has a hydrogen concentration of less than about 5 percent.

11. The semiconductor device of claim 9, wherein the gapfill film has a hydrogen concentration of less than about 20 percent.

12. The semiconductor device of claim 9, wherein the conformal silicon liner layer is in direct contact with the substrate surface and the sidewalls and the bottom surface of the at least one feature.

13. The semiconductor device of claim 12, wherein the gapfill film is in direct contact with the conformal silicon liner layer.

14. The semiconductor device of claim 9, wherein the at least one feature is a high aspect ratio trench.

15. The semiconductor device of claim 14, wherein the high aspect ratio trench has an aspect ratio of greater than or equal to 10:1.

16. The semiconductor device of claim 15, wherein a combined thickness of the conformal silicon liner layer on the sidewalls is less than 90% of a width of the bottom surface of the at least one feature.

17. A semiconductor device, comprising:
    a substrate having a substrate surface and at least one feature formed thereon, the at least one feature extending from the substrate surface and having sidewalls and a bottom surface; and
    a gapfill layer disposed over the substrate surface and the sidewalls and the bottom surface of the at least one feature and filling the at least one feature,
    wherein the gapfill layer is substantially seam-free and comprises amorphous silicon having hydrogen concentration of less than 20 percent.

18. The semiconductor device of claim 17, wherein the gapfill layer is in direct contact with the substrate surface and the sidewalls and the bottom surface of the at least one feature.

19. The semiconductor device of claim 18, wherein the at least one feature is a high aspect ratio trench.

20. The semiconductor device of claim 19, wherein the high aspect ratio trench has an aspect ratio of greater than or equal to 10:1.

* * * * *